(12) United States Patent
Shirai

(10) Patent No.: US 8,847,683 B2
(45) Date of Patent: Sep. 30, 2014

(54) DIFFERENTIAL AMPLIFYING CIRCUIT

(75) Inventor: Noriaki Shirai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 30 days.

(21) Appl. No.: 13/446,698

(22) Filed: Apr. 13, 2012

(65) Prior Publication Data
US 2012/0262236 A1 Oct. 18, 2012

(30) Foreign Application Priority Data

Apr. 14, 2011 (JP) ................................ 2011-090454

(51) Int. Cl.
*H03F 3/45* (2006.01)
(52) U.S. Cl.
CPC ........................................ *H03F 3/45* (2013.01)
USPC ........................................... 330/253; 330/305
(58) Field of Classification Search
CPC ........................................................ H03F 3/45
USPC .................................. 330/252–253, 302, 305
See application file for complete search history.

(56) References Cited

U.S. PATENT DOCUMENTS

| | | | |
|---|---|---|---|
| 4,048,578 A * | 9/1977 | Kimura | 330/305 |
| 6,448,847 B1 * | 9/2002 | Paul et al. | 327/563 |
| 7,023,272 B2 * | 4/2006 | Hung et al. | 330/126 |
| 7,236,802 B2 | 6/2007 | Cairo | |
| 2011/0051473 A1 | 3/2011 | Glaser et al. | |

FOREIGN PATENT DOCUMENTS

| | | |
|---|---|---|
| JP | 2004-282499 A | 10/2004 |
| JP | 2005-160026 A | 6/2005 |
| JP | 2009-094570 A | 4/2009 |
| JP | 2010-068165 A | 3/2010 |
| JP | 2011-50238 A | 3/2011 |

OTHER PUBLICATIONS

Japanese Office Action with partial translation dated Aug. 5, 2014 issued in Japanese Patent Application No. 2011-090454.

* cited by examiner

*Primary Examiner* — Robert Pascal
*Assistant Examiner* — Khiem Nguyen
(74) *Attorney, Agent, or Firm* — Arent Fox LLP

(57) ABSTRACT

A differential amplifying circuit includes: two metal oxide semiconductor transistors to form a differential pair and receive a differential signal; a plurality of capacitance elements coupled in series between drains of the two metal oxide semiconductor transistors; and an inductance circuit coupled between at least one connection node of the plurality of capacitance elements and a bias power terminal.

9 Claims, 16 Drawing Sheets

US 8,847,683 B2

DIFFERENTIAL AMPLIFYING CIRCUIT

CROSS-REFERENCE TO RELATED APPLICATION

This application is based upon and claims the benefit of priority of the prior Japanese Patent Application No. 2011-090454, filed on Apr. 14, 2011, the entire contents of which are incorporated herein by reference.

FIELD

The embodiments discussed herein are related to a differential amplifying circuit.

BACKGROUND

An amplifying circuit that amplifies a differential signal is used in a semiconductor device. The amplifying circuit includes two metal oxide semiconductor (MOS) transistors that have substantially the same characteristics and form a differential pair. Substantially identical loads are coupled between respective drains of the two MOS transistors and one power terminal. Sources of the two MOS transistors are indirectly or directly coupled to the other power terminal. Thus, a symmetrical differential pair is generated. When differential signals are applied to respective gates of the two MOS transistors, differential outputs are obtained from the respective drains of the two MOS transistors. The two MOS transistors may be coupled to each other at their sources, and a common load may be coupled between a connection node of the sources and the other power terminal. A differential circuit may or may not include a common load. A differential amplifying circuit may include an amplifying circuit that amplifies a differential signal.

Related art is disclosed, for example, in Japanese Laid-open Patent Publication Nos. 2009-094570, 2010-068165, and 2005-160026.

SUMMARY

According to an aspect of the invention, a differential amplifying circuit includes: two metal oxide semiconductor transistors to form a differential pair and receive a differential signal; a plurality of capacitance elements coupled in series between drains of the two metal oxide semiconductor transistors; and an inductance circuit coupled between at least one connection node of the plurality of capacitance elements and a bias power terminal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Second harmonics of a differential amplifying circuit are generated at respective output terminals of differential outputs when they are in phase. When the second harmonics are in phase, they may not be output by conversion to a single-ended output. The symmetry of transistors or loads included in a differential pair may not be maintained due to process variations, for example, variations in devices caused by manufacturing processes. As a result, the second harmonics of the differential outputs may become out of phase and the output of the second harmonics may increase.

The amplifying circuit may have a capacitance switching function for phase correction which makes second harmonics which are out of phase due to process variations or the like closer to an in-phase condition. By switching the capacitance of each differential output, the phase of a second harmonic of each differential output may be corrected, so that the output of second harmonics may be reduced. The adjustment of capacitance may cause an imbalance in amplitude between differential outputs. The adjustment of capacitance may change a differential impedance of a fundamental frequency, and may change a gain of the fundamental frequency.

Figure 1A:
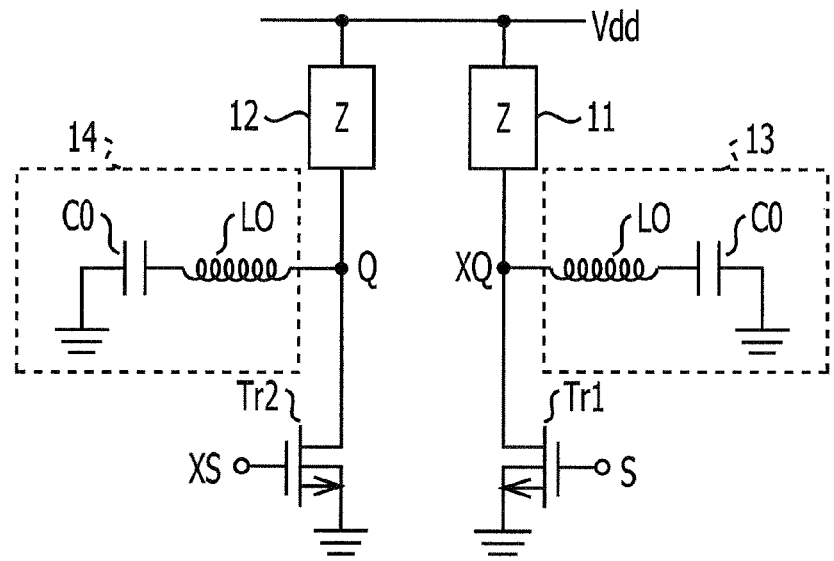
FIG. 1A and FIG. 1B illustrate an exemplary differential amplifying circuit.
Figure 1B:
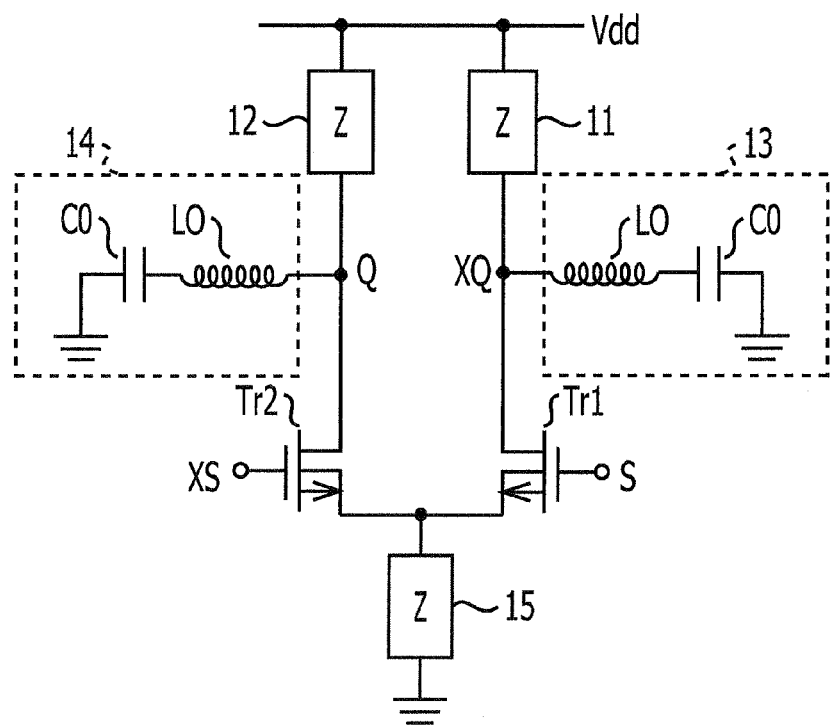

FIG. 1A and FIG. 1B illustrate an exemplary differential amplifying circuit. A differential amplifying circuit may include a series resonant circuit which includes an inductor and a capacitor. The differential amplifying circuit illustrated in FIG. 1A may not include a common load, and the differential amplifying circuit illustrated in FIG. 1B may include a common load.

As illustrated in FIG. 1A, a row of a load 11 and an n-channel metal oxide semiconductor (NMOS) transistor Tr1 coupled in series and a row of a load 12 and an NMOS transistor Tr2 coupled in series are arranged in parallel between a high-potential power terminal Vdd and a low-potential power terminal GND. The load 11 and the load 12 may be substantially the same or similar in characteristics. The NMOS transistor Tr1 and the NMOS transistor Tr2 may also be substantially the same or similar in characteristics. The two symmetrical rows form a differential pair. A differential input signal S and a differential input signal XS are input to gates of the NMOS transistor Tr1 and the NMOS transistor Tr2, respectively. Since the two rows are symmetrical, differential outputs may be obtained from a connection node XQ of the load 11 and the NMOS transistor Tr1 and from a connection node Q of the load 12 and the NMOS transistor Tr2, for example, from drains of the NMOS transistor Tr1 and the NMOS transistor Tr2. The loads 11 and 12 each may include an inductance element or a resistor. The differential amplifying circuit may include p-channel metal oxide semiconductor (PMOS) transistors, instead of NMOS transistors.

In the differential amplifying circuit illustrated in FIG. 1A, series resonant circuits 13 and 14 are coupled to drain terminals of the NMOS transistor Tr1 and the NMOS transistor Tr2, respectively. The series resonant circuits 13 and 14 each include an inductor and a capacitor that resonate at a second harmonic frequency. Specifically, the series resonant circuits 13 and 14 each include an inductance element L0 and a capacitance element C0 coupled in series between the corresponding drain terminal and the ground. In a differential circuit, an inductance value of the inductance element L0 may be set to LS and a capacitance value of the capacitance element C0 may be set to CS for a second harmonic frequency $f_2$, such that the equation $f_2=1/(2\pi(LC)^{1/2})$ is established. The series resonant circuits 13 and 14 may reduce impedance for the second harmonic frequency $f_2$ at the connection nodes XQ and Q, and may reduce generation of second harmonics.

In the differential amplifying circuit illustrated in FIG. 1B, the NMOS transistors Tr1 and Tr2 in the differential amplifying circuit illustrated in FIG. 1A are coupled to each other at their source terminals, and their connection node is coupled through a common load 15 to the low-potential power terminal GND. The other elements illustrated in FIG. 1B may be substantially the same as or similar to those illustrated in FIG. 1A. The common load 15 may be a constant current source.

The differential amplifying circuits illustrated in FIG. 1A and FIG. 1B may reduce generation of second harmonics. Since the inductance element L0 and the capacitance element C0 included in the corresponding series resonant circuit 13 or 14 are provided for the drain terminal of each of the NMOS transistors Tr1 and Tr2 included in the differential pair, the circuit area may increase.

Figure 2:
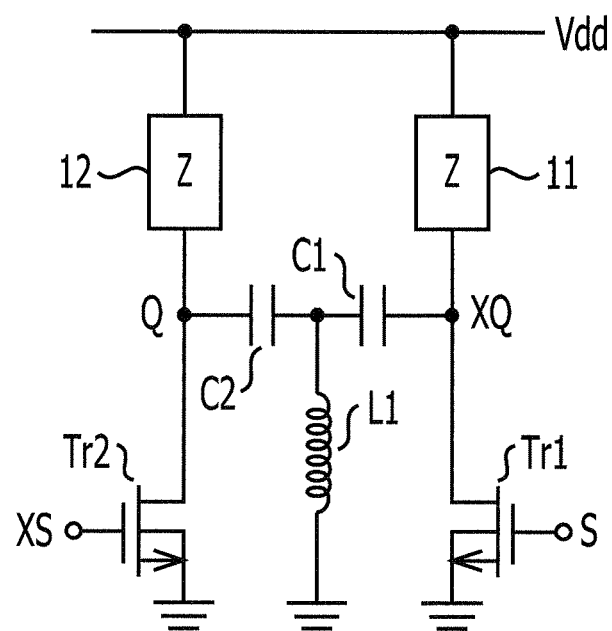
FIG. 2 illustrates an exemplary differential amplifying circuit.

FIG. 2 illustrates an exemplary differential amplifying circuit. In the differential amplifying circuit illustrated in FIG. 2, a row of the load 11 and the NMOS transistor Tr1 coupled in series and a row of the load 12 and the NMOS transistor Tr2 coupled in series are arranged in parallel between the high-potential power terminal Vdd and the low-potential power terminal GND. The loads 11 and 12 may be substantially the same or similar in characteristics. The NMOS transistors Tr1 and Tr2 may also be substantially the same or similar in characteristics. The two symmetrical rows may form a differential pair. The differential input signals S and XS are input to the gates of the NMOS transistors Tr1 and Tr2, respectively. Differential outputs may be obtained from the drains XQ and Q of the NMOS transistors Tr1 and Tr2, respectively. The loads 11 and 12 each may include an inductance element or a resistor.

The differential amplifying circuit illustrated in FIG. 2 includes two capacitance elements C1 and C2 and an inductance element L1. The capacitance elements C1 and C2 are coupled in series between the drains XQ and Q of the NMOS transistors Tr1 and Tr2. The inductance element L1 is coupled between a connection node of the two capacitance elements C1 and C2 and the low-potential power terminal GND.

Figure 3A:
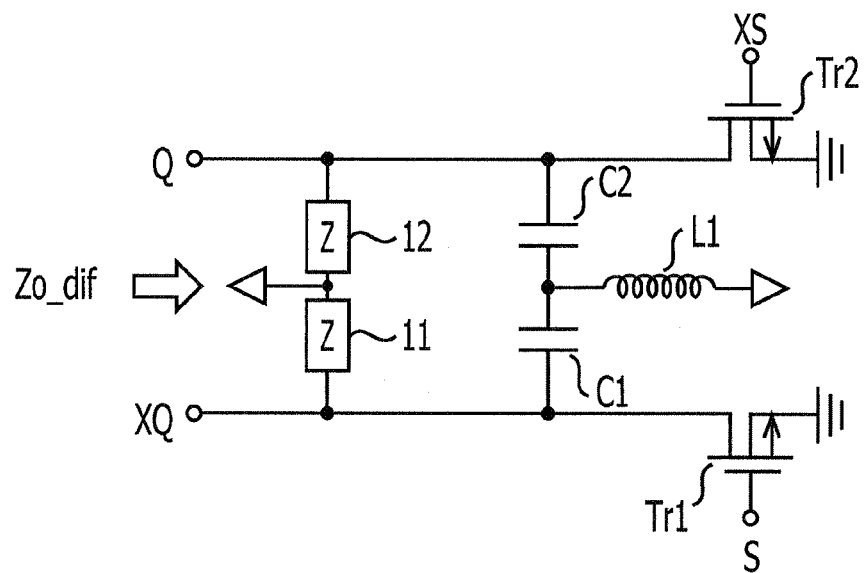
FIG. 3A and FIG. 3B illustrate an exemplary differential amplifying circuit.
Figure 3B:
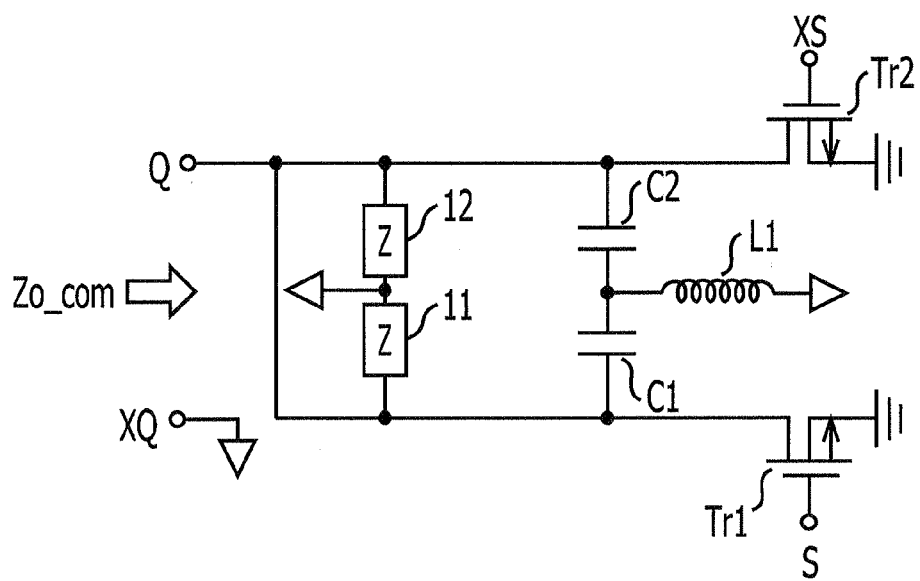

FIG. 3A and FIG. 3B illustrate an exemplary differential amplifying circuit. The differential amplifying circuit illustrated in FIG. 3A may operate for a differential impedance. The differential amplifying circuit illustrated in FIG. 3B may operate for a common mode impedance.

In the differential amplifying circuit illustrated in FIG. 3A, a differential impedance Zodif of an output of a differential amplifier that determines a differential gain of a fundamental frequency $f_1$ may be expressed by the following equation:

$$Zodif=2Z/(1+j\omega_1 C)$$

where Z is an impedance of the loads 11 and 12, $\omega_1$ is an angular frequency of the fundamental frequency $f_1$, and C is a capacitance value of the capacitance elements C1 and C2.

In the differential amplifying circuit illustrated in FIG. 3B, a common mode impedance Zocom that determines a common mode gain for the second harmonic frequency $f_2$ may be expressed by the following equation:

$$Zocom=(Z(2\omega_2^2 LC-1))/(2j(2\omega_2^2 LC-1)+2\omega_2 C)$$

where $\omega_2$ is an angular frequency of the second harmonic frequency $f_2$ and L is an inductance value of the inductance element L1.

When the capacitance value C and the inductance value L are set for the angular frequency $\omega_2$ such that the equation $(2\omega_2^2 LC--1)=0$ is established, the common mode impedance Zocom for the second harmonic frequency $f_2$ may be substantially zero and a gain for an in-phase second harmonic frequency may be substantially zero. Thus, the occurrence of second harmonics may be reduced. When the relationship between the capacitance value C and the capacitance value CS of the capacitance element C0 illustrated in FIG. 1A and FIG. 1B is C=CS, the relationship between the inductance value L and the inductance value LS of the inductance element L0 illustrated in FIG. 1A and FIG. 1B may be L=LS/2. The inductance value L of the inductance element L1 illustrated in FIG. 3A and FIG. 3B may be a quarter of a total inductance value of the inductance elements L0 illustrated in FIG. 1A and FIG. 1B. The circuit size may thus be reduced. The differential amplifying circuits illustrated in FIG. 3A and FIG. 3B each include the two capacitance elements having substantially the same capacitance values.

Figure 4:
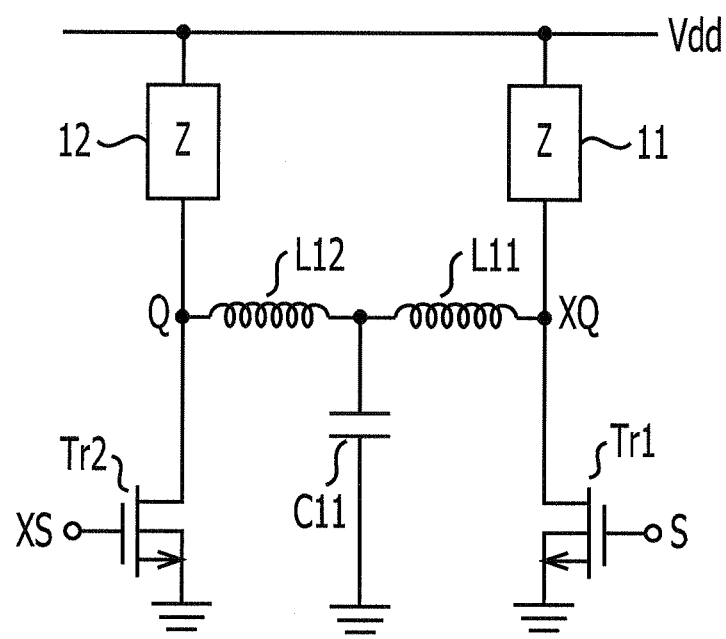
FIG. 4 illustrates an exemplary differential amplifying circuit.

FIG. 4 illustrates an exemplary differential amplifying circuit. The differential amplifying circuit illustrated in FIG. 4 includes an inductance element L11, an inductance element L12, and a capacitance element C11. The inductance elements L11 and L12 correspond to the capacitance elements C1 and C2 illustrated in FIG. 2, and the capacitance element C11 corresponds to the inductance element L1 illustrated in FIG. 2. The other elements illustrated in FIG. 4 may be substantially the same as or similar to those illustrated in FIG. 2.

In the differential amplifying circuit illustrated in FIG. 4, the two inductance elements L11 and L12 are coupled in series between the drain terminals of the NMOS transistors Tr1 and Tr2 that form a differential pair, and the capacitance element C11 is coupled between a connection node of the inductance elements L11 and L12 and the low-potential power terminal GND.

Figure 5A:
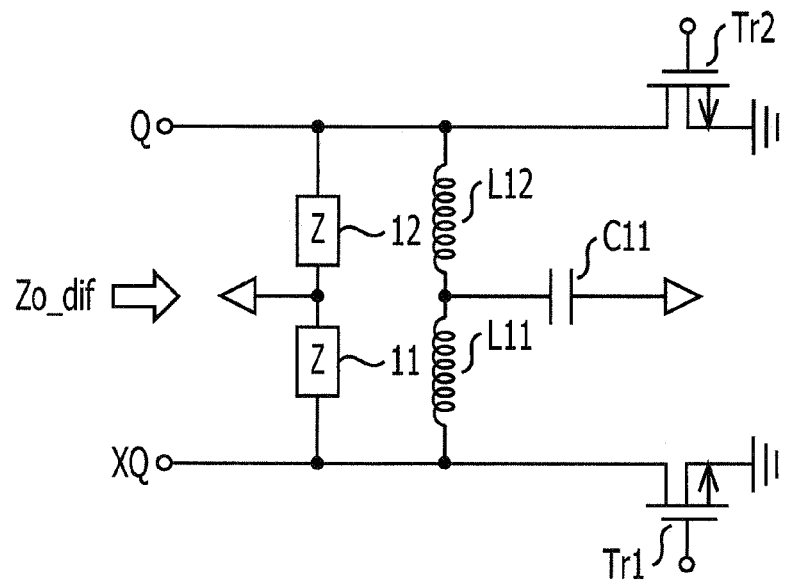
FIG. 5A and FIG. 5B illustrate an exemplary differential amplifying circuit.
Figure 5B:
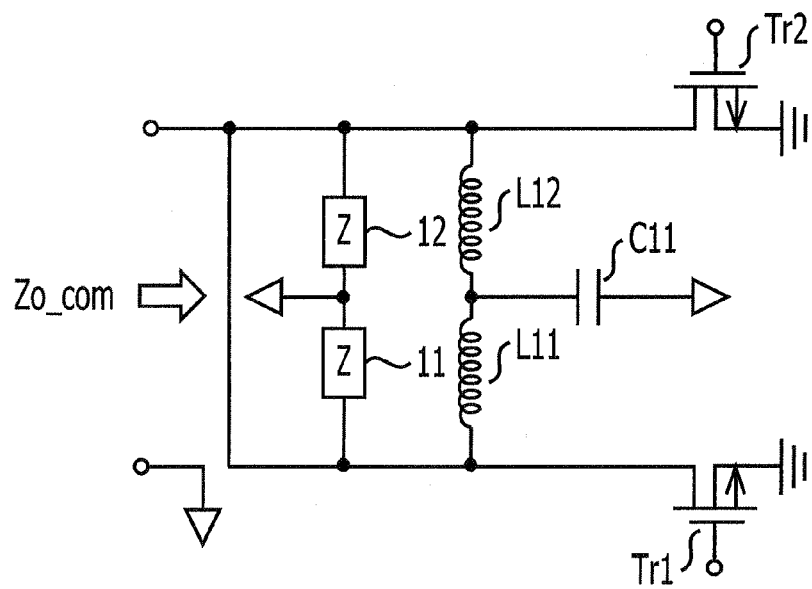

FIG. 5A and FIG. 5B illustrate an exemplary differential amplifying circuit. The differential amplifying circuit illustrated in FIG. 5A may operate for a differential impedance. The differential amplifying circuit illustrated in FIG. 5B may operate for a common mode impedance.

In the differential amplifying circuit illustrated in FIG. 5A, the differential impedance Zodif of an output of a differential amplifier that determines a differential gain of the fundamental frequency $f_1$ may be expressed by the following equation:

$$Zodif=(j2Z\omega_1 L)/(Z+j\omega_1 L)$$

where Z is an impedance of the loads 11 and 12, $\omega_1$ is an angular frequency of the fundamental frequency $f_1$, and L is an inductance value of the inductance elements L11 and L12.

In the differential amplifying circuit illustrated in FIG. 5B, the common mode impedance Zocom that determines a common mode gain for the second harmonic frequency $f_2$ may be expressed by the following equation:

$$Zocom=(Z(1-2\omega_2^2 LC))/(2(1-2\omega_2^2 LC)+j\omega_2 CZ)$$

where $\omega_2$ is an angular frequency of the second harmonic frequency $f_2$ and C is a capacitance value of the capacitance element C11.

When the capacitance value C and the inductance value L are set such that the equation $Z(1-2\omega_2^2 LC)=0$ is established, the common mode impedance Zocom for the second harmonic frequency $f_2$ may become substantially zero and a gain for an in-phase second harmonic frequency may become substantially zero. Thus, no second harmonic may be occurred. When the relationship between the inductance value L and the inductance value LS of the inductance element L0 illustrated in FIG. 1A and FIG. 1B is L=LS, the relationship between the capacitance value C and the capacitance value CS of the capacitance element C0 illustrated in FIG. 1A and FIG. 1B may be C=CS/2. The capacitance value C of the capacitance element C11 illustrated in FIG. 5A and FIG. 5B may be a quarter of a total capacitance value of the capacitance elements C0 illustrated in FIG. 1A and FIG. 1B. The circuit size may thus be reduced. The differential amplifying circuits illustrated in FIG. 5A and FIG. 5B each may include the two inductance elements having substantially the same inductance values.

Figure 6:
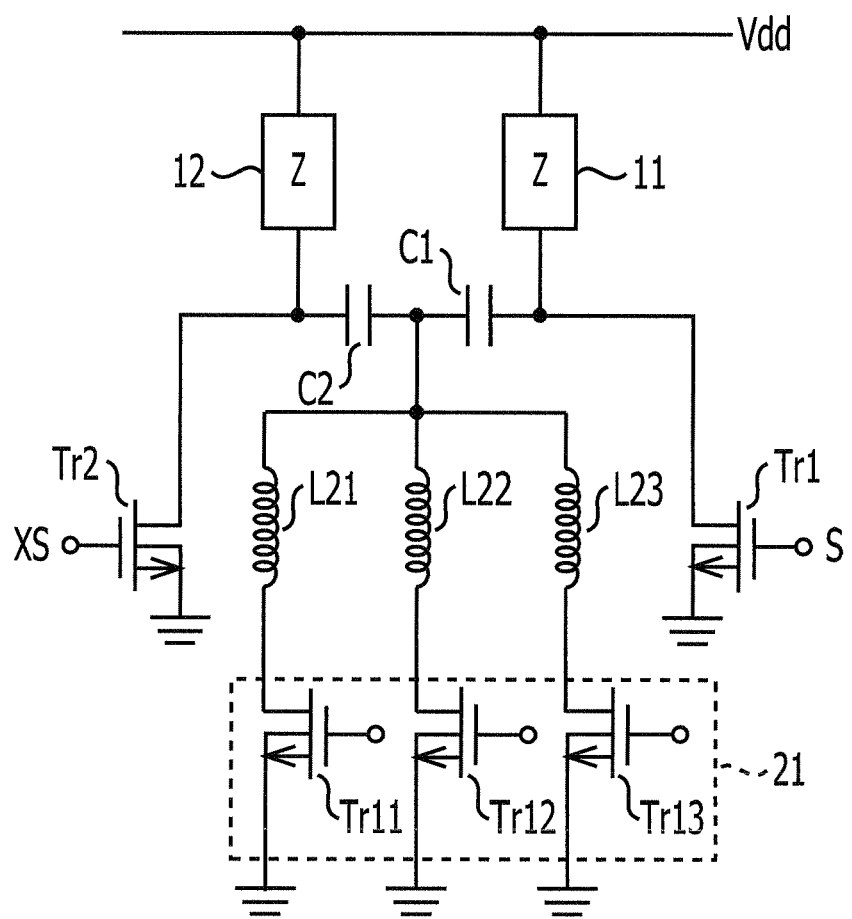
FIG. 6 illustrates an exemplary differential amplifying circuit.

FIG. 6 illustrates an exemplary differential amplifying circuit. The differential amplifying circuit illustrated in FIG. 6 includes an inductance circuit having a variable inductance value, instead of the inductance element L1 illustrated in FIG. 2. The other elements illustrated in FIG. 6 may be substantially the same as or similar to those illustrated in FIG. 2. The inductance circuit includes a row of an inductance element L21 and an NMOS transistor Tr11 coupled in series, a row of an inductance element L22 and an NMOS transistor Tr12 coupled in series, and a row of an inductance element L23 and an NMOS transistor Tr13 coupled in series. The rows are coupled between a connection node of the capacitance elements C1 and C2 and the low-potential power terminal GND. A selection signal is input to a switching circuit 21 which includes the three NMOS transistors Tr11 to Tr13. One or more transistors to be brought into conduction (i.e., to be turned on) are selected from the NMOS transistors Tr11 to Tr13, and the corresponding one or more inductance elements to be coupled between the connection node of the capacitance elements C1 and C2 and the low-potential power terminal GND are selected. An inductance value may be a composite value of inductance values of the one or more coupled inductance elements. The variable inductance circuit may include one or more NMOS transistors and may have resolutions or variable widths of different variable inductors.

Figure 7:
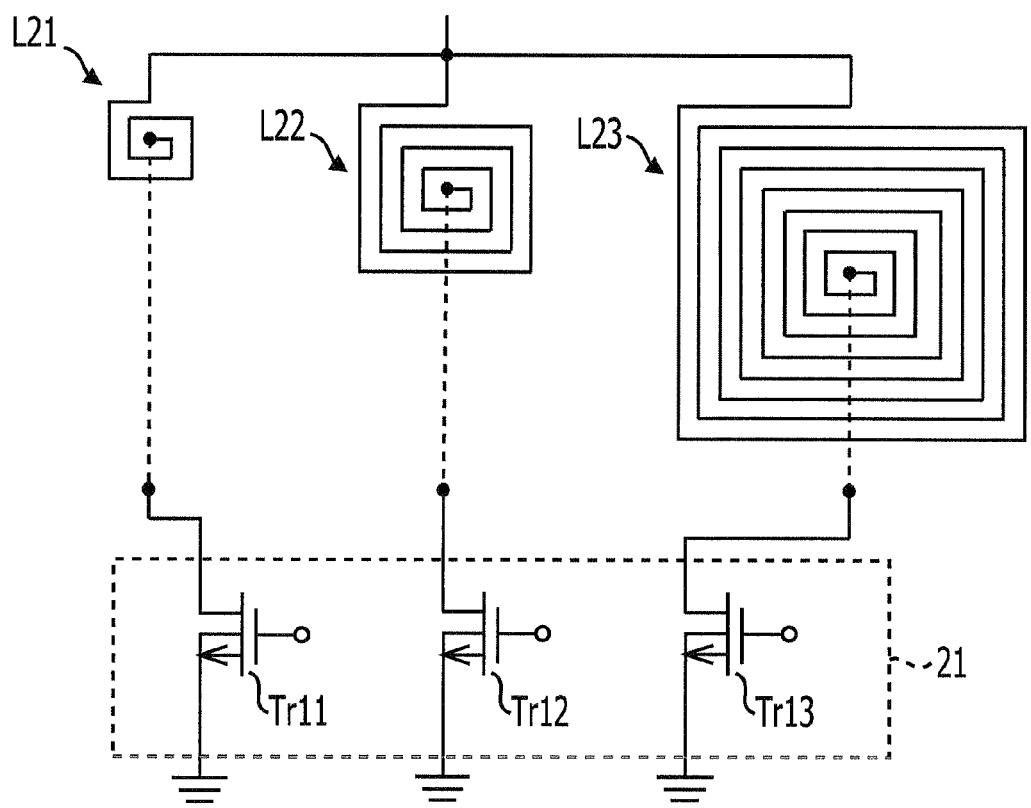
FIG. 7 illustrates an exemplary inductance circuit.

FIG. 7 illustrates an exemplary inductance circuit. The inductance circuit illustrated in FIG. 7 may be the variable inductance circuit illustrated in FIG. 6. In the inductance elements L21, L22, and L23, the inductance element L21 has the largest number of coil turns and the inductance element L23 has the smallest. The ratio of inductance values of the inductance elements L21, L22, and L23 is set to 1:2:4. For example, the largest inductance value measured when the NMOS transistors Tr11 to Tr13 included in the switching circuit 21 are turned on may be seven times the smallest inductance value measured when the NMOS transistor Tr11 is turned on and the other transistors are turned off. A transistor to be turned on is selected from the NMOS transistors Tr11 to Tr13, and the inductance value changes from the smallest inductance value to the largest inductance value.

Figure 8:
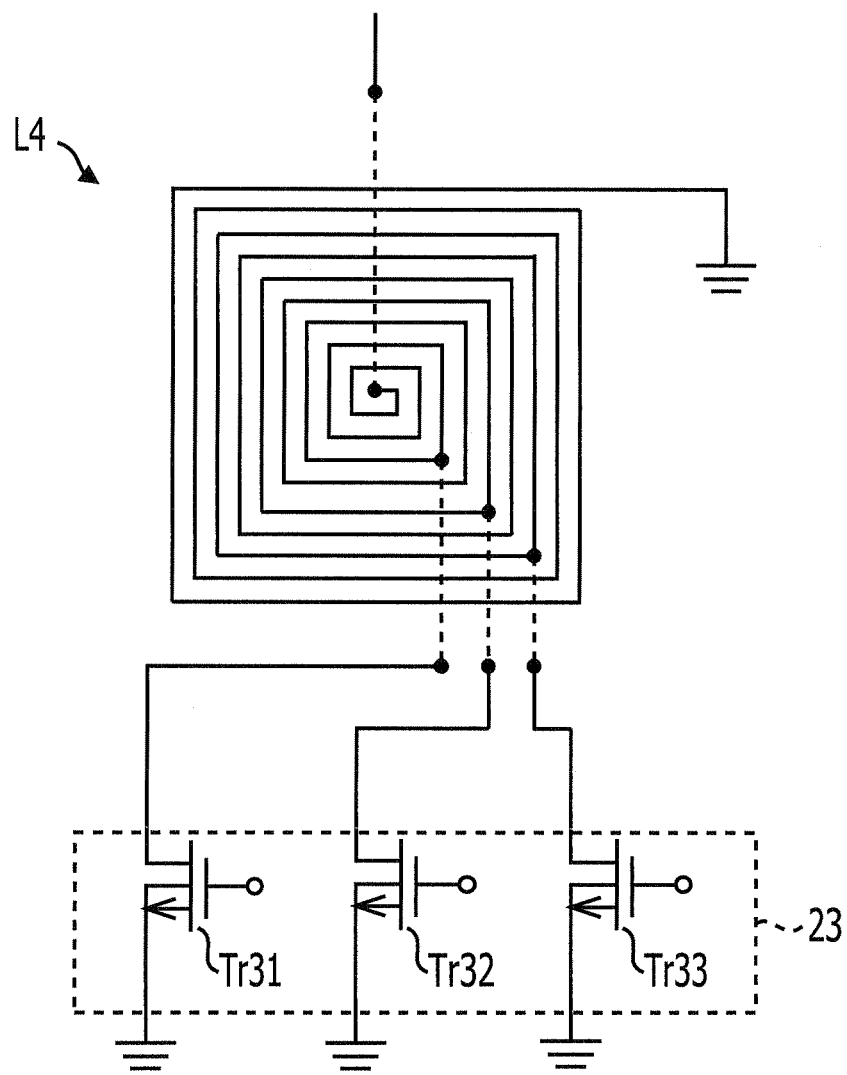
FIG. 8 illustrates an exemplary inductance circuit.

FIG. 8 illustrates an exemplary inductance circuit. The inductance circuit illustrated in FIG. 8 may be the variable inductance circuit illustrated in FIG. 6. The inductance circuit illustrated in FIG. 8 includes an inductance element L4 having a coil with a large number of turns. The coil is coupled, at three points in the middle, to the low-potential power terminal GND, through NMOS transistors Tr31, Tr32, and Tr33 included in a switching circuit 23. For example, the number of turns of the inductance element L4 when the NMOS transistor Tr31 is turned on may be three, the number of turns of the inductance element L4 when the NMOS transistor Tr31 is turned off and the NMOS transistor Tr32 is turned on may be five, the number of turns of the inductance element L4 when the NMOS transistors Tr31 and Tr32 are turned off and the NMOS transistor Tr33 is turned on may be seven, and the number of turns of the inductance element L4 when the NMOS transistors Tr31 to Tr33 are turned off may be nine. Since the inductance value changes depending on the number of turns of the inductance element L4, a transistor to be turned on is selected from the NMOS transistors Tr31 to Tr33 and the inductance value changes.

In the differential amplifying circuit illustrated in FIG. 6, process variations in capacitors and inductors that determine common mode impedance for the second harmonic frequency $f_2$ are compensated such that the impedance for the second harmonic frequency $f_2$ becomes substantially zero. When a variable inductance value is changed by the compensation of process variations in devices, a differential impedance that determines a gain of the fundamental frequency $f_1$ may be expressed as $Zodif=2Z/(1+j\omega_1 C)$. Thus, the differential impedance may not be dependent on the variable inductance value. A change in gain for the fundamental frequency $f_1$ is reduced and the common mode impedance is adjusted.

Figure 9:
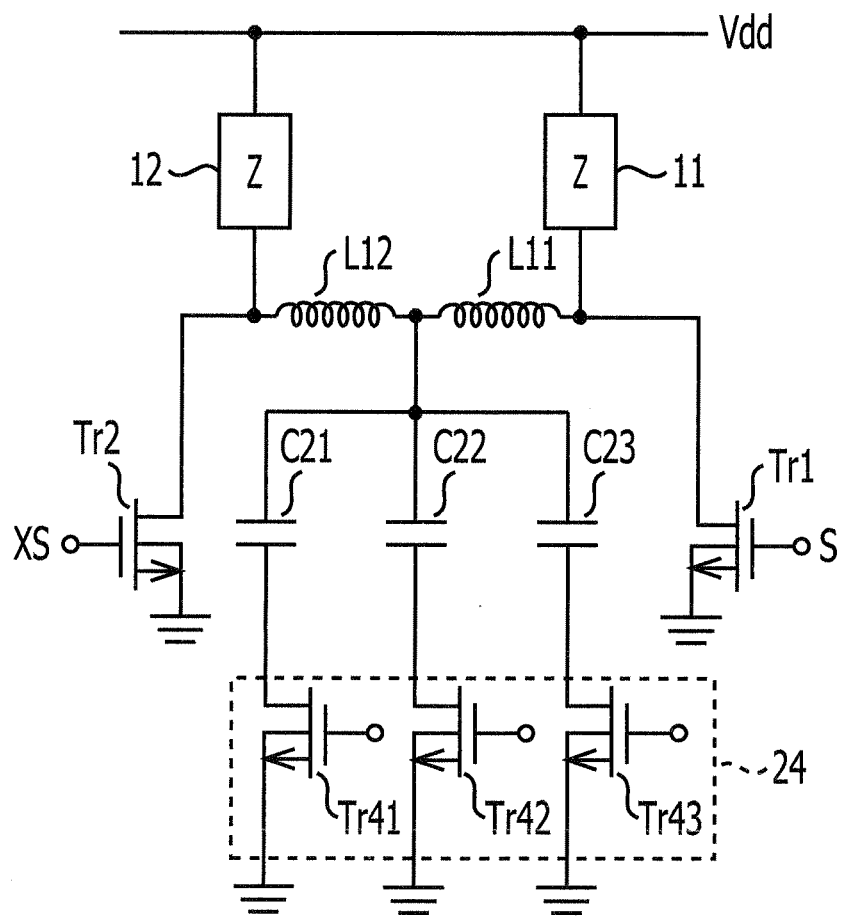
FIG. 9 illustrates an exemplary differential amplifying circuit.

FIG. 9 illustrates an exemplary differential amplifying circuit. The differential amplifying circuit illustrated in FIG. 9 includes a variable capacitance circuit, instead of the capacitance element C11 illustrated in FIG. 4. The other elements illustrated in FIG. 9 may be substantially the same as or similar to those illustrated in FIG. 4. The capacitance circuit includes a row of a capacitance element C21 and an NMOS transistor Tr41 coupled in series, a row of a capacitance element C22 and an NMOS transistor Tr42 coupled in series, and a row of a capacitance element C23 and an NMOS transistor Tr43 coupled in series. The rows are coupled between a connection node of the inductance elements L11 and L12 and the low-potential power terminal GND. A selection signal is input to a switching circuit 24 which includes the three NMOS transistors Tr41 to Tr43. One or more transistors to be brought into conduction (i.e., to be turned on) are selected from the NMOS transistors Tr41 to Tr43, and the corresponding one or more capacitance elements to be coupled between the connection node of the inductance elements L11 and L12 and the low-potential power terminal GND are selected. A capacitance value may be a sum of capacitance values of the one or more connected capacitance elements. The variable capacitance circuit may include one or more NMOS transistors and may have resolutions or variable widths of different variable capacitors.

Process variations in capacitors and inductors that determine common mode impedance for the second harmonic frequency may be compensated such that the impedance for the second harmonic frequency becomes substantially zero. When a variable capacitance value is changed by the compensation of process variations in devices, a differential impedance that determines a gain of the fundamental frequency $f_1$ may be expressed as Zodif=$(j2Z\omega_1 L)/(Z+j\omega_1 L)$. Thus, since the differential impedance is not dependent on the variable capacitance value, a change in gain for the fundamental frequency $f_1$ is reduced and the common mode impedance is adjusted.

A connection node of two capacitance elements or of two inductance elements coupled between the drain terminals XQ and Q of two transistors included in a differential pair may be coupled to the low-potential power terminal GND. The connection node may be coupled to the high-potential power terminal Vdd.

Figure 10:
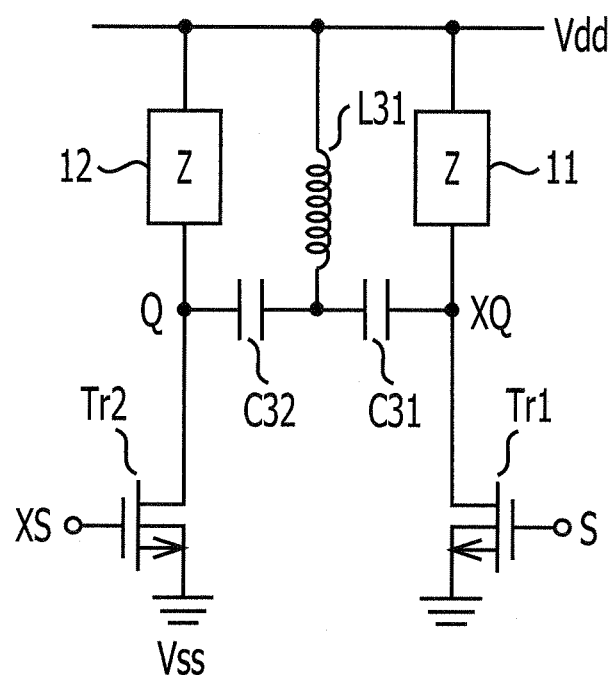
FIG. 10 illustrates an exemplary differential amplifying circuit.

FIG. 10 illustrates an exemplary differential amplifying circuit. In the differential amplifying circuit illustrated in FIG. 10, the connection node is coupled to the high-potential power terminal Vdd. The elements illustrated in FIG. 10 are substantially the same as or similar to those illustrated in FIG. 2 and their description may be omitted or reduced.

Figure 11:
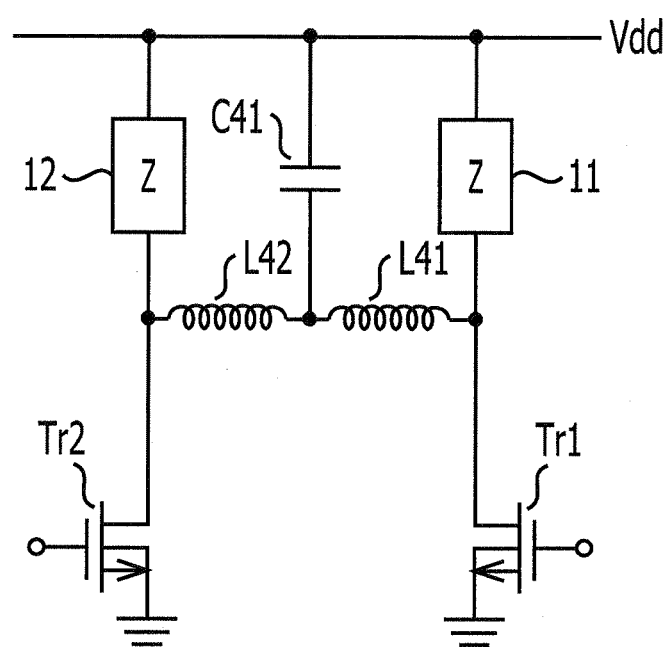
FIG. 11 illustrates an exemplary differential amplifying circuit.

FIG. 11 illustrates an exemplary differential amplifying circuit. In the differential amplifying circuit illustrated in FIG. 11, the connection node is coupled to the high-potential power terminal Vdd. The elements illustrated in FIG. 11 may be substantially the same as or similar to those illustrated in FIG. 4 and their description may be omitted or reduced.

Figure 12:
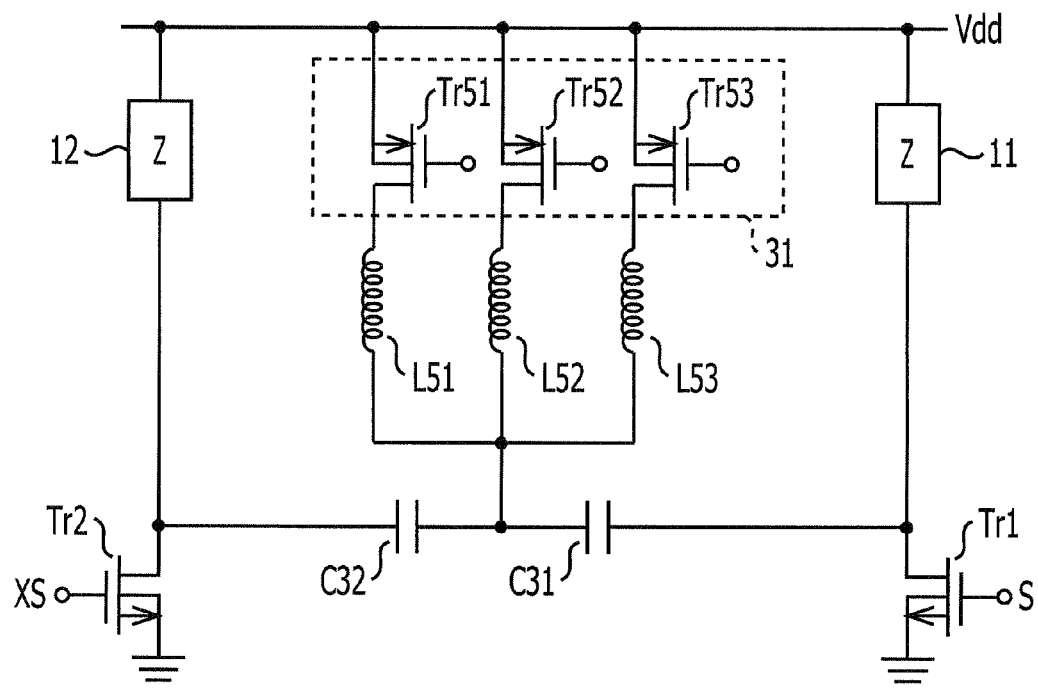
FIG. 12 illustrates an exemplary differential amplifying circuit.

FIG. 12 illustrates an exemplary differential amplifying circuit. In the differential amplifying circuit illustrated in FIG. 12, the connection node is coupled to the high-potential power terminal Vdd. PMOS transistors Tr51, Tr52, and Tr53 are used as transistors of a switching circuit 31. The other elements illustrated in FIG. 12 may be substantially the same as or similar to those illustrated in FIG. 6 and their description may be omitted or reduced.

Figure 13:
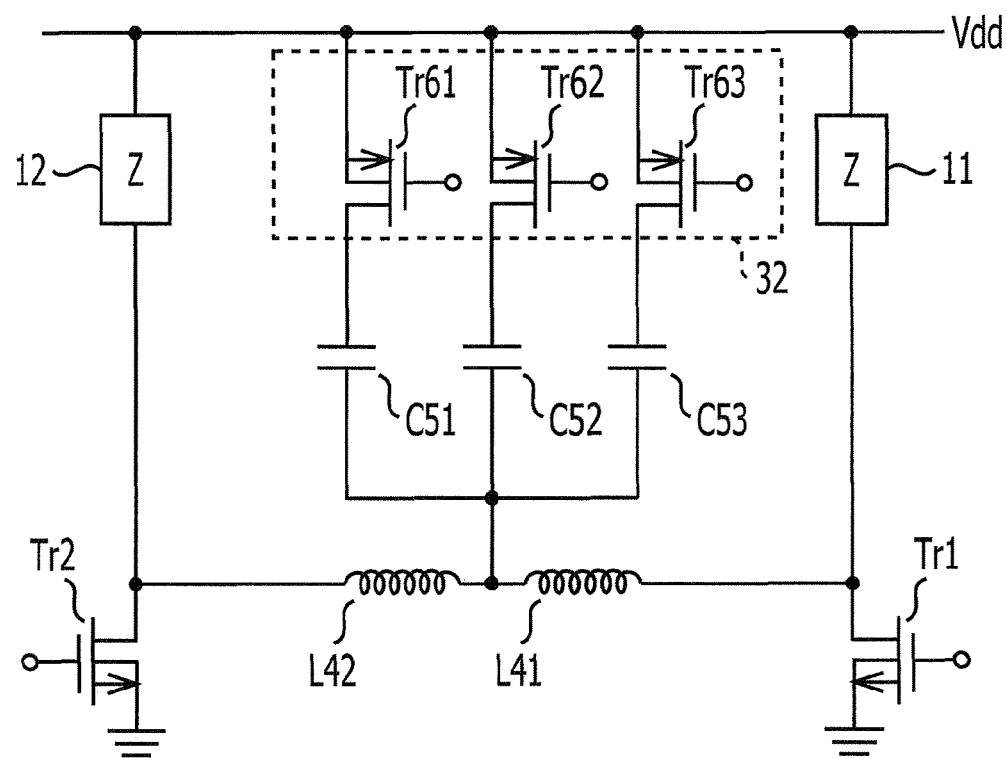
FIG. 13 illustrates an exemplary differential amplifying circuit.

FIG. 13 illustrates an exemplary differential amplifying circuit. In the differential amplifying circuit illustrated in FIG. 13, the connection node is coupled to the high-potential power terminal Vdd. PMOS transistors Tr61, Tr62, and Tr63 are used as transistors of a switching circuit 32. The other elements illustrated in FIG. 13 may be substantially the same as or similar to those illustrated in FIG. 9 and their description may be omitted or reduced.

Since, in the differential amplifying circuits described above, common mode impedance that contributes to generation of second harmonics with a small number of devices is reduced, second harmonics are reduced. When grounded inductance elements or capacitance elements are adjusted to compensate for process variations, differential impedance for the fundamental frequency $f_1$ may not change. Thus, although common mode impedance for second harmonics changes, a gain of the fundamental frequency $f_1$ may not change.

The differential amplifying circuits described above may include no common load, as in the case of FIG. 1A, or may include a common load, as in the case of FIG. 1B.

Figure 14:
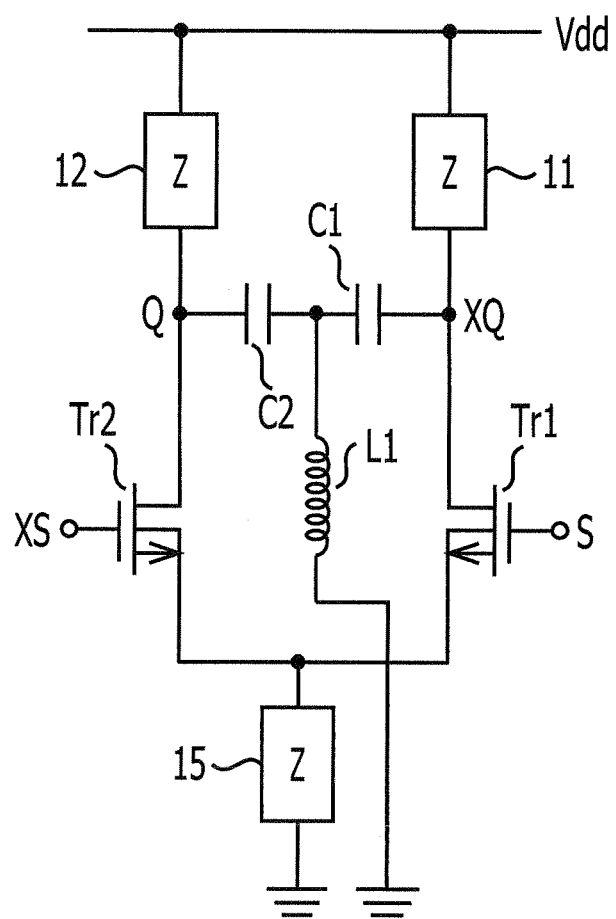
FIG. 14 illustrates an exemplary differential amplifying circuit.

FIG. 14 illustrates an exemplary differential amplifying circuit. The differential amplifying circuit illustrated in FIG. 14 includes the common load 15. The other elements illustrated in FIG. 14 may be substantially the same as or similar to those illustrated in FIG. 2 and their description may be omitted or reduced. The differential amplifying circuit illustrated in any of FIG. 4, FIG. 6, and FIG. 9 to FIG. 13 may include the common load 15.

In the differential amplifying circuit illustrated in FIG. 14, MOS transistors included in a differential pair may be either NMOS transistors or PMOS transistors.

Figure 15:
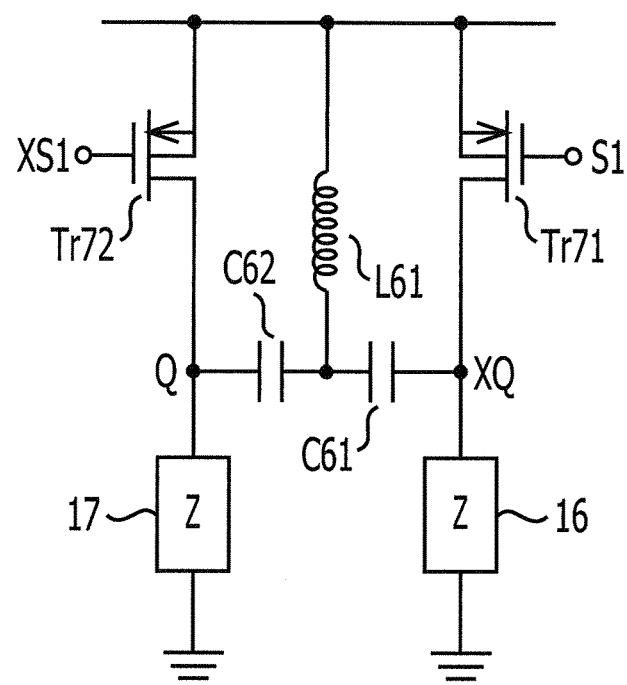
FIG. 15 illustrates an exemplary differential amplifying circuit.

FIG. 15 illustrates an exemplary differential amplifying circuit. The differential amplifying circuit illustrated in FIG. 15 may include PMOS transistors instead of NMOS transistors. The other elements illustrated in FIG. 15 may be substantially the same as or similar to those illustrated in FIG. 2 and their description may be omitted or reduced. The differential amplifying circuit illustrated in any of FIG. 4, FIG. 6, and FIG. 9 to FIG. 13 may include PMOS transistors instead of NMOS transistors. The PMOS transistors of the switching circuits 31 and 32 illustrated in FIG. 12 and FIG. 13 may be NMOS transistors.

A characteristics simulation of the differential amplifying circuits illustrated in FIG. 1A and FIG. 2 is performed. In the simulation, the fundamental frequency $f_1$ may be set to 835 MHz and the second harmonic frequency $f_2$ may be set to 1670 MHz. In the differential amplifying circuit illustrated in FIG. 1A, the capacitance value CS of the capacitance element C0 and the inductance value LS of the inductance element L0 may be set to 1 pF and 0.992 nH, respectively, based on the equation $f_2=1/(2\pi(LS*CS)^{1/2})$. In the differential amplifying circuit illustrated in FIG. 2, the capacitance value C of the capacitance elements C1 and C2 and the inductance value L of the inductance element L1 may be set to 1 pF and 4.546 nH, respectively, based on the equation $f_2=1/(2\pi(L*2C)^{1/2})$. A total inductance value corresponding to FIG. 2 may be a quarter of an inductance value corresponding to FIG. 1A.

Figure 16:
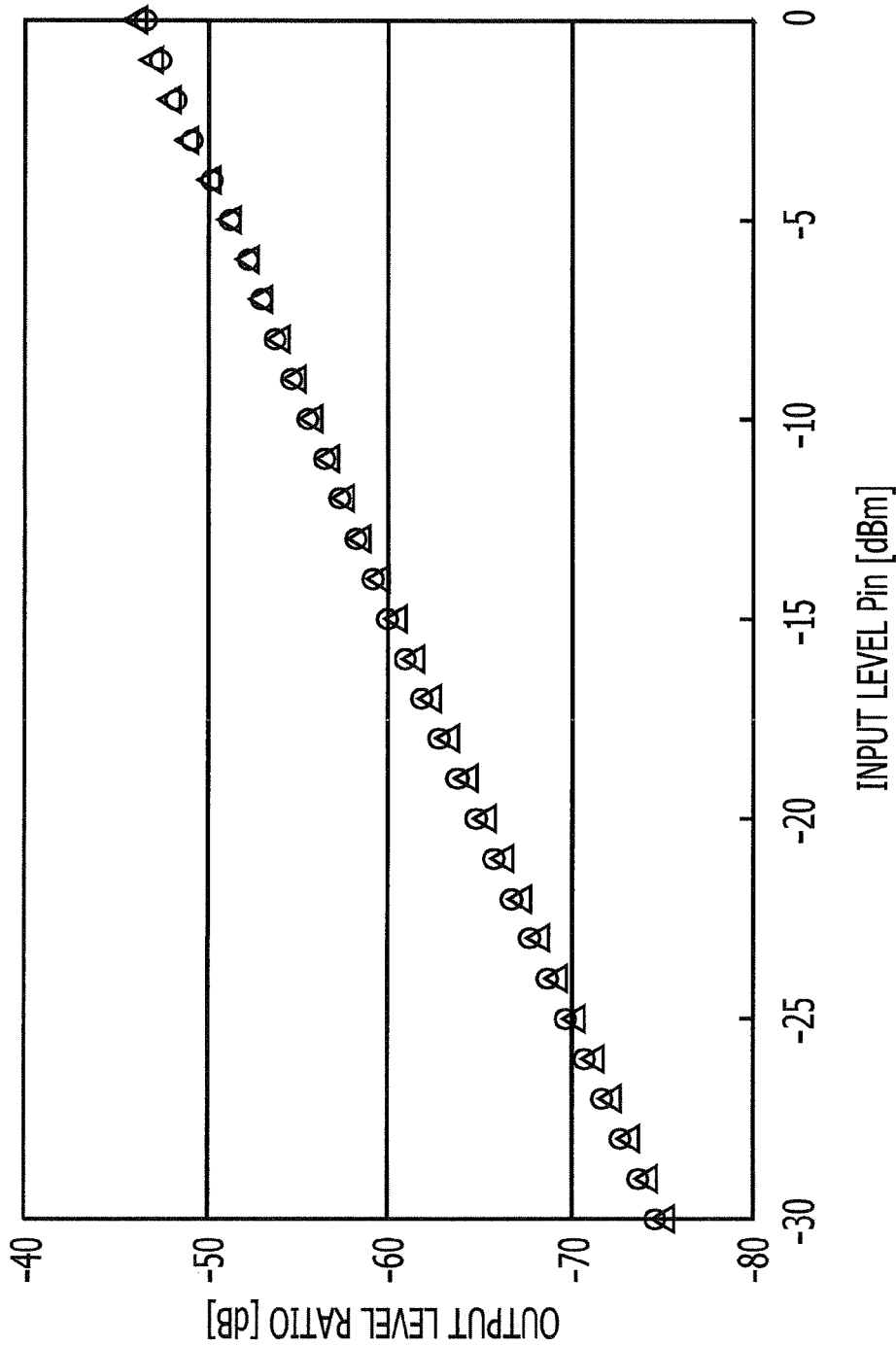
FIG. 16 illustrates an exemplary simulation result.

FIG. 16 illustrates an exemplary simulation result. The horizontal axis represents input level Pin in dBm, and the vertical axis represents output level ratio in dB. Circular symbols represent results of simulation of the differential amplifying circuit illustrated in FIG. 1A. Triangular symbols represent results of simulation of the differential amplifying circuit illustrated in FIG. 2. The output level ratio increases in proportion to the input level. Values represented by the circular symbols may be substantially the same as the corresponding values represented by the triangular symbols. The number of devices in the differential amplifying circuit illustrated in FIG. 2 is smaller than that of devices in the differential amplifying circuit illustrated in FIG. 1A. Also, the circuit area of the differential amplifying circuit illustrated in FIG. 2 is smaller than that of the differential amplifying circuit illustrated in FIG. 1A. However, the differential amplifying circuit illustrated in FIG. 2 may have substantially the same characteristics as those of the differential amplifying circuit illustrated in FIG. 1A.

Since the differential amplifying circuits described above reduces common mode impedance that contributes to generation of second harmonics, second harmonics are reduced. When grounded inductance elements or capacitance elements are variably adjusted to compensate for process variations, differential impedance for the fundamental frequency $f_1$ may not change. Thus, although common mode impedance for second harmonics changes, a gain of the fundamental frequency $f_1$ may not change.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A differential amplifying circuit comprising:
two metal oxide semiconductor transistors to form a differential pair and receive a differential signal;

a plurality of capacitance elements coupled in series between drains of the two metal oxide semiconductor transistors; and an inductance circuit coupled between at least one connection node of the plurality of capacitance elements and a bias power terminal, wherein an inductance value of the inductance circuit is variable, wherein the inductance circuit includes a plurality of inductance elements and a switching circuit to select at least one of the plurality of inductance elements.

2. The differential amplifying circuit according to claim 1, further comprising, a first load element coupled between at least one of the drains of the two metal oxide semiconductor transistors and one of a high-potential power terminal and a low-potential power terminal.

3. The differential amplifying circuit according to claim 2, further comprising, a second load element coupled between a connection node of sources of the two metal oxide semiconductor transistors and the other of the high-potential power terminal and the low-potential power terminal.

4. The differential amplifying circuit according to claim 1, wherein the bias power terminal is a low-potential power terminal.

5. The differential amplifying circuit according to claim 1, wherein the bias power terminal is a high-potential power terminal.

6. The differential amplifying circuit according to claim 1, wherein the two metal oxide semiconductor transistors are n-channel metal oxide semiconductor transistors.

7. The differential amplifying circuit according to claim 1, wherein the two metal oxide semiconductor transistors are p-channel metal oxide semiconductor transistors.

8. A differential amplifying circuit comprising:

two metal oxide semiconductor transistors to form a differential pair and receive a differential signal;

a plurality of inductance elements coupled in series between drains of the two metal oxide semiconductor transistors; and a capacitance circuit coupled between at least one connection node of the plurality of inductance elements and a bias power terminal, wherein a capacitance value of the capacitance circuit is variable, wherein the capacitance circuit includes a plurality of capacitance elements and a switching circuit to select at least one of the plurality of capacitance elements.

9. A differential amplifying circuit comprising:

two metal oxide semiconductor transistors to form a differential pair and receive a differential signal;

a plurality of capacitance elements coupled in series between drains of the two metal oxide semiconductor transistors;

an inductance circuit coupled between at least one connection node of the plurality of capacitance elements and a bias power terminal, a first load element coupled between at least one of the drains of the two metal oxide semiconductor transistors and one of a high-potential power terminal and a low-potential power terminal; and a second load element coupled between a connection node of sources of the two metal oxide semiconductor transistors and the other of the high-potential power terminal and the low-potential power terminal.

* * * * *